United States Patent
Vanden Bossche

(10) Patent No.: US 11,933,848 B2
(45) Date of Patent: Mar. 19, 2024

(54) MEASUREMENT SYSTEM FOR CHARACTERIZING A DEVICE UNDER TEST

(71) Applicant: National Instruments Ireland Resources Limited, Dublin (IE)

(72) Inventor: Marc Vanden Bossche, Bornem (BE)

(73) Assignee: National Instruments Ireland Resources Limited, Dublin (IE)

(*) Notice: Subject to any disclaimer, the term of this patent is extended or adjusted under 35 U.S.C. 154(b) by 0 days.

(21) Appl. No.: 18/303,340

(22) Filed: Apr. 19, 2023

(65) Prior Publication Data
US 2023/0251312 A1    Aug. 10, 2023

Related U.S. Application Data

(63) Continuation of application No. 17/579,991, filed on Jan. 20, 2022, now Pat. No. 11,644,505.
(Continued)

(51) Int. Cl.
G01R 31/319    (2006.01)
G01R 31/302    (2006.01)

(52) U.S. Cl.
CPC ... *G01R 31/31905* (2013.01); *G01R 31/3025* (2013.01)

(58) Field of Classification Search
CPC .......... G01R 31/31905; G01R 31/3025; G01R 27/28; G01R 31/31926; G01R 1/06766; G01R 31/31937
(Continued)

(56) References Cited

U.S. PATENT DOCUMENTS 7,486,067 B2    2/2009  Bossche
8,841,923 B1    9/2014  Vanwiggeren
(Continued)

FOREIGN PATENT DOCUMENTS

CN    101701988 B    1/2012
WO    WO-2005121817 A1 * 12/2005 ............. G01R 27/28
(Continued)

OTHER PUBLICATIONS

Hall, David et al., "Multi-Channel Phase-Coherent FR Measurement System Architectures and Performance Considerations", 2014 IEEE Military Communications Conference; pp. 1318-1323.
(Continued)

*Primary Examiner* — Tung X Nguyen
*Assistant Examiner* — Robert P Alejnikov, Jr.
(74) *Attorney, Agent, or Firm* — Kowert, Hood, Munyon, Rankin & Goetzel, P.C.; Jeffrey C. Hood

(57) ABSTRACT

In a measurement system, a signal probing circuit may provide probed signals by probing voltages and currents and/or incident and reflected waves at a port of a device under test (DUT). A multi-channel receiver structure may include receivers that receive two probed signals from the signal probing hardware circuit, each receiver having its own sample clock derived from a master clock and further having a respective digitizer for digitizing a corresponding one of the two probed signals. A synchronization block, external to the receivers and including a reference clock derived from the master clock, may enable the two probed signals to be phase coherently digitized across the receivers by synchronizing the respective sample clocks of the receivers while the reference clock is being shared with the receivers. A signal processing circuit may then process the phase coherently digitized probed signals.

20 Claims, 10 Drawing Sheets

Related U.S. Application Data

(60) Provisional application No. 63/139,873, filed on Jan. 21, 2021.

(58) Field of Classification Search
USPC .................................................. 324/756.01
See application file for complete search history.

(56) References Cited

U.S. PATENT DOCUMENTS

| | | | |
|---|---|---|---|
| 9,791,484 B2 | 10/2017 | Pailloncy et al. | |
| 10,062,454 B1 | 8/2018 | Merugu et al. | |
| 2003/0102907 A1 * | 6/2003 | Tasker | G01R 27/28 330/2 |
| 2006/0111861 A1 | 5/2006 | Horne et al. | |
| 2007/0236230 A1 | 10/2007 | Tanbakuchi et al. | |
| 2008/0048673 A1 | 2/2008 | Tan et al. | |
| 2008/0048677 A1 | 2/2008 | Tan et al. | |
| 2014/0327429 A1 | 11/2014 | Ziomek et al. | |
| 2015/0280899 A1 | 10/2015 | Vanden Bossche | |
| 2018/0054294 A1 | 2/2018 | Rappaport et al. | |
| 2018/0203050 A1 | 7/2018 | Winston et al. | |
| 2019/0383873 A1 | 12/2019 | Hojabri et al. | |
| 2020/0011912 A1 | 1/2020 | Quan | |

FOREIGN PATENT DOCUMENTS

| | | | | |
|---|---|---|---|---|
| WO | WO-2009131444 A1 * | 10/2009 | ............. | G01R 27/32 |
| WO | WO-2013127911 A1 * | 9/2013 | ............. | G01R 27/32 |

OTHER PUBLICATIONS

International Search Report and Written Opinion; International Application No. PCT/EP2022/051160; dated May 9, 2022; 10 pgs.

* cited by examiner

MEASUREMENT SYSTEM FOR CHARACTERIZING A DEVICE UNDER TEST

PRIORITY CLAIM

This application is a continuation of U.S. application Ser. No. 17/579,991, titled "Measurement System for Characterizing a Device Under Test", filed on Jan. 20, 2022, which claims benefit of priority to U.S. Provisional Application No. 63/139,873, titled "Measurement System for Characterizing a Device Under Test", filed on Jan. 21, 2021, both of which are hereby incorporated by reference as though fully and completely set forth herein.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, any disclaimer made in the instant application should not be read into or against the parent application or other related applications.

FIELD OF THE INVENTION

The present invention is generally related to the field of signal acquisition and processing, more in particular to systems and methods for synchronizing a plurality of receivers and for making vector measurements.

BACKGROUND OF THE INVENTION

One of the key requirements for 5G communications is the support of very high data rates. One option to enable higher data rates is to increase the system bandwidths in the order of 1 to 2 GHz end more. Contiguous wide bandwidth is in particular available at higher mm-wave frequencies such as 28 GHz and above. To overcome the high path loss at those frequencies one can use antenna array technology to bundle and steer the radiated energy to a specific direction.

In order to enable those new antenna technologies several improvements to the RF part of the wireless transmission system are currently being investigated:

Active antenna systems (AAS) need one power amplifier (PA) per antenna element. Therefore, one needs to characterize multiple RF ports simultaneously to measure indirect interactions between the PAs, which occur via the coupling of the different antenna elements.

For the PA system, power efficiency needs to be improved e.g. by developing new power amplifier architectures using Envelope Tracking (ET), Digital Pre-Distortion (DPD) or Load Modulation.

During the RF system design phase one needs to increase the linearity of system level components to avoid non-linear distortions in the transceivers because they would lead to Error Vector Magnitude (EVM) degradations.

RF system components need to get characterized under modulated wideband conditions using realistic signals (e.g. 5G New Radio (NR) compatible OFDM waveform) as continuous wave (CW) would be only usable as approximation which is not sufficient anymore when investigating the trade-offs between non-linear effects and power efficiency. Moreover, the modulation signals may not be periodic.

Since active antenna systems, both in sub-6 GHz and mm-wave frequencies and beyond, play an important role in 5G, automotive and aerospace & defense applications, platforms capable of characterizing these systems, combined with innovative measurement techniques, will be essential to improve their design to achieve excellent power efficiency combined with a high level of linearity due to the information density. Therefore, there is a need to characterize (e.g. monitoring the impact on power efficiency and linearity) the sub-components of AAS in their linear and non-linear behavior under dynamic impedance conditions (non-50 Ohm). As the test signals need to cover the increasing modulation bandwidth of interest, the distortion of signal conditioning, signal path loss and mismatch between instrument and device under test (DUT) requires instrumentation that can correct the generated signal up to the DUT or as closely as possible to the DUT. The same holds for receiving modulation signals which are even wider due to non-linearities. Additionally, the device under test, part of an AAS, is loaded with a non-50 Ohm impedance which changes depending on the coupling with the neighboring antenna elements. The high number of different PA channels requires scalable multi-port instruments. The above-mentioned challenges are even more critical for devices at mm-wave and higher frequencies due to the high carrier frequencies corresponding to smaller wavelengths. This leads to impedance mismatches which are more sensitive to changes in the signal chain at those frequencies. This effect is increased when dealing with antenna arrays that can cause further impedance mismatches depending on the used beamforming, which influences the coupling. The higher bandwidth used at those frequencies can lead to a higher degree of amplitude and phase distortion e.g. due to higher sensitivity to phase noise which is more severe at mm-wave frequencies and higher. Additionally, it is also more difficult to design broadband matched circuits at such frequencies.

Furthermore, different types of physical interfaces at the device under test need to be supported. This includes standard connectorized DUT interfaces (e.g. with SMA connectors) but also measurement interfaces on wafer, which are more difficult to access and need special probes. As such, proper calibration techniques need to be foreseen to extract the correct error coefficients for these different interface types. On top of that, also de-embedding needs to be supported to move the calibration planes, e.g. to cope with additional RF components, such as multiplexers or probes, that are placed between the coupler and the DUT. Each passive component between the calibration plane (where the coupler is located) and the DUT can be de-embedded if accurately characterized by its S-parameters or one can decide to perform a calibration at the DUT, which automatically includes the effect of the in-between hardware.

In RF design validation and verification Vector Network Analyzers (VNAs) are intensively used. Using such a VNA one can cope with non-50 Ohm conditions through the measurement of S-parameters of the DUT which can predict behavior under any non-50 Ohm condition as long the DUT is linear. VNAs are often limited to CW characterization and the number of ports is usually difficult to scale. Moreover, they are strictly limited to measurements with simple periodic signals, which are not common in practical AAS applications. On the other side, a Vector Signal Generator (VSG)/Vector Signal Analyzer (VSA) architecture can be used to cope with the high bandwidth requirement but cannot characterize and calibrate out the path distortions and mismatches between the instrumentation and the DUT. The main reason is that the VSG/VSA do not allow for methods for measuring for each port incident and reflected waves which are important to determine and take into account the interactions between the instrumentation and each port of the DUT, where one wants to measure. The VSG/VSA are designed specifically for 50 Ohm matched environments. Further they do not support easy scaling up the measurement ports either.

Therefore, there is a need for adequate characterization capabilities to improve the design of present and future PA systems which are essential for AAS, specifically:
  multi-port scalability in RF hardware and software
  wideband vector corrected modulated signal generation and measurements up to the DUT
  characterization of linearity and power efficiency and EVM in non-50 Ohm environments
  enable new characterization approaches, e.g. broadband load pull techniques to characterize the impact of antenna element coupling on to the PA behavior
  affordable and easy to calibrate and use system architecture adaptable from design to production The multi-port capabilities of current commercially available equipment is often limited to no more than 4 ports. Extending the 4-ports to more ports can be achieved using one or more switches to connect to different external ports. This, however, degrades the measurement quality, specifically at mm-wave and higher frequencies because of the increasing mismatches and losses between the instrument ports and the DUT.

Related to regular VSG and VSA characterization in 50 Ohm environment, equipment has recently been made available on the market which is referred to as Vector Signal Transceivers (VSTs). Such VSTs combine a VSG and VSA in a single device in combination with a shared FPGA. VST architectures meet the need for wider modulation bandwidth, possibly at higher frequencies and enabling the direct coupling between receiving and generation, but they miss the capability to deal with increasing distortion between instrument and device under test (loss and mismatch affecting the measurement accuracy of both amplitude and phase). Thus, the linearity and EVM measurements performed in VST architectures are inaccurate and not comparable between setups as it depends on the instrumentation—DUT interaction. Further, they do not provide the necessary measurements to analyze non-linear devices (e.g. amplifiers) adequately under non-50 Ohm conditions, essential for increasing the power efficiency.

VNA architectures, on the other hand, focus mainly on S-parameter capability extended with some modulation capability by using a relatively narrowband frequency scanning receiver and by adding an external modulation source to complement its regular continuous wave (CW) source. Even though linearity and EVM measurements are possibly with such extension, the frequency scanning enforces in practice the use of short compact test signals instead of standard-compliant test signals.

Hence, there is a need for a measurement system wherein one or more of the above-mentioned drawbacks or limitations are mitigated, avoided or overcome.

SUMMARY OF THE INVENTION

It is an object of embodiments of the present invention to provide for a measurement system that is scalable across multiple ports of a device under test. It is also an object of embodiments of the present invention to provide for a measurement system capable of measuring quantities that are important to active antenna systems under modulated conditions, e.g. linearity, power efficiency, adjacent channel power ratio, error vector magnitude and more, while applying periodic and non-periodic signals, e.g. compact test signals, standard-compliant test signals and more.

The above objective is accomplished by the solution according to the present invention.

In a first aspect the invention relates to a measurement system for determining voltage and current or incident and reflected wave at at least one port of a device under test, DUT, whereby the DUT is excited by at least one modulated signal. The measurement system comprises:
  at least one signal probing hardware circuit adapted to provide probed signals resulting from probing, at a port of the DUT, while allowing a signal to flow towards the DUT or while arranged to provide a termination to the DUT, one or more of voltage and current or incident and reflected wave,
  a multi-channel receiver structure comprising a plurality of receivers, configured to receive two probed signals coming from at least one of the signal probing hardware circuits, wherein each receiver of the plurality of receivers comprises a respective digitizer for digitizing a corresponding one of the probed signals, said respective digitizer having its own sample clock derived from a master clock,
  a synchronization block external to the plurality of receivers and comprising a reference clock derived from the master clock, the synchronization block configured to enable the two probed signals to be phase coherently digitized across the plurality of receivers by synchronizing the respective sample clocks of the receivers while the reference clock is being shared with the plurality of receivers,
  a signal processing circuit configured to process the two phase coherently digitized probed signals.

The proposed solution allows for performing phase coherent measurements across multiple ports of the DUT in a scalable way. In the proposed measurement system, a signal probing hardware circuit for signal probing is available per DUT port for which voltage and current or incident and reflected waves need to be measured. The signal probing hardware circuit sends a signal corresponding to the incident wave or input voltage to one receiver of a multi-channel receiver structure and a signal corresponding to the reflected wave or current to another receiver of the multi-channel receiver structure. The received signals are converted from the analog to the digital domain with a digitizer provided with an own sample clock. A key component of the measurement system according to the invention is the synchronization block external to the multi-channel receiver structure, which comprises a reference clock. When this reference clock is shared with the receivers, the sample clocks of the various receivers can so be synchronized. In this way phase coherent measurements can be performed of probed signals across the various receivers. A signal processing circuit is provided to further process the phase coherent measurements, i.e. the phase coherently digitized probed signals.

In a second aspect the invention relates to a measurement system for determining voltage and current or incident and reflected wave at at least one port of a device under test, DUT, whereby the DUT is excited by at least one modulated signal. The measurement system comprises:
  at least one signal probing hardware circuit configured to provide probed signals resulting from probing the voltage and current or incident and reflected wave at a port of the DUT while allowing a signal to flow towards the DUT or while being arranged to provide a termination to the DUT, a multi-channel receiver structure comprising one or more receivers, at least one of which is provided with a switch arranged to switch between a plurality of probed signals coming from one of said signal probing hardware circuits, each of the one or more receivers comprising a respective digitizer for digitizing a received one of the probed signals, the respective digitizer having its own sample clock derived from a master clock, a signal reconstruction processing circuit configured to identify in a phase coherent way the individual digitized probed signals of the plurality of probed signals applied to the switch and if the multi-channel receiver structure comprises more than one receiver, a synchronization block external to the more than one receivers, said synchronization block comprising a reference clock derived from the master clock and adapted to synchronize the respective sample clocks of the receivers while the reference clock is being shared with the receivers, thereby enabling obtaining phase coherent measurements of probed signals across the more than one receiver, the measurement system further comprising a signal processing circuit arranged to process the phase coherent measurements of the digitized probed signals.

The measurement system according to the second aspect of the invention differs from the one described above in that at least one receiver is provided with a switch that can switch between the probed modulated signals coming from the at least one signal probing hardware circuit. In case there is only one receiver in the multi-channel receiver structure the probed modulated signals corresponding to a multitude of channels are consecutively applied to the receiver where they are digitized while switching and with some further processing the probed modulated signals per channel are phase coherently reconstructed. In case there is more than one receiver in the receiver structure, there may be one or more receivers with a switch and possibly one or more receivers without a switch, i.e. receivers as already described before in the first aspect. In the case with more than one receiver in the receiver structure the measurement system also needs to comprise a synchronization block external to the various receivers. Just as in the first aspect this synchronization block comprises a reference clock, which can be shared with the receivers (which each have their own sample clock). Again phase coherent measurements of probed modulated signals are so made possible, which can be further processed in the signal processing means of the measurement system.

In preferred embodiments each receiver comprises a synchronization circuit adapted for interacting with the external synchronization block.

Preferably the external synchronization block is arranged for cooperating with the signal processing means.

Advantageously, the measurement system is arranged to process a collection of samples as a burst or to process the samples sample-per-sample in a continuous streaming mode.

In a preferred embodiment the signal processing means is arranged to operate synchronously with said digitizers.

In a preferred embodiment the measurement system comprises a hardware module comprising two receivers per pair of signals probed at a port of the DUT or per port of the signal probing hardware, and an own, dedicated signal processing circuit. In an advantageous embodiment two receivers and a signal source are integrated in one module of the measurement system, with optionally the capability to provide a termination to the DUT.

In another embodiment at least one receiver comprises a downconverter. In some embodiments at least two receivers comprise a downconverter and a local oscillator is shared between the at least two receivers.

In one embodiment a signal probing hardware circuit connected to a port of the DUT is arranged to probe only one signal. This signal is either the incident wave signal or the reflected wave signal.

In embodiments of the invention at least one signal probing hardware circuit can be set in pass through to directly connect a receiver of the multi-channel receiver structure to the DUT.

In some embodiments the measurement system of the invention is arranged for measuring voltages and currents at frequencies e.g. in the low GHz range towards DC or, at higher frequencies above a few tens of MHz, for performing measurements of incident and reflected waves by means of couplers or via any other means providing directly or indirectly information of the incident and reflected waves.

In some embodiments the measurement system further comprises at least one signal generator for generating excitation signals, i.e. the modulated signals. Advantageously the at least one signal generator is adapted to cooperate with the signal processing means.

Preferably at least two signal generators arranged to be connected to the master clock, are connected to the external synchronization block or to another external synchronization block and arranged to receive the reference clock to synchronize respective sample clocks of the at least two generators. In some embodiments the two or more signal generators have their own synchronization means.

A vector correction refers to the correction typically performed inside a vector network analyzer (VNA). The uncorrected or raw measurements of a VNA, which are typically performed per frequency under a stimulus of a sine wave at that frequency, represent an uncorrected measure for the incident and the reflected waves at the different ports of a device under test (DUT) or the ratios of the waves as complex numbers (amplitude and phase) at that frequency. The vector correction, considering the distortion created by the instrument in interaction with the device under test transforms per frequency the uncorrected measure into a representation of the waves at the DUT ports. In a VNA the vector correction is used to determine the S-parameters of a DUT. More specifically, the invention also relates to a vector correction performed by the signal processing block on the digitized data, coming from the multi-channel receiver structure to the signal processing block, to reconstruct current and voltage or incident and reflected waves at the calibration plane. The correction is performed by the signal processing block and can be done in the frequency domain on discrete frequencies. This requires periodic signals or a collection of consecutive samples, referred to as a burst of the signal, which can be treated as periodic signals. In this case the burst or a number of consecutive signal samples, corresponding possibly to at least one period, is collected before performing the transformation to the frequency domain. Alternatively, the correction can be realized in the time domain using a combination of digital time-domain filters. These digital time-domain filters are typically the result of fitting techniques on the frequency domain error coefficients, determined during a calibration process where typically periodic signals are used. The advantage of the correction in time domain is that the signal can not only be a burst or finite set of signal samples that are processed through the filters, but can be continuously digitized and processed by the time-domain filters. One refers to this as the streaming mode. In the streaming mode the signal processing block and the digitizers need to work synchronously so that the signal processing block can run sample per sample through the digital filters. Both the time and frequency domain approach represent the same correction reconstruction from the digital signals to the signals at the DUT. The correction in the frequency domain on a discrete frequency grid requires the use of periodic signals or of at least a burst of signals with some additional processing to take care of possible signal leakage using e.g. windowing techniques. The digital time-domain filters enable the use of non-periodic signals and enable continuous streaming, resulting into a continuous data stream representing the voltage and current or incident/reflected wave at the DUT. In the latter case one cannot use receivers with switches scanning the channels of the signal probing hardware circuit, as one would lose the coherency between the signals from the different channels. As such, for receivers with switches periodic signals are a requirement. In some embodiments the signal processing means is arranged for performing a vector correction on the digitized modulated signals by means of digital time-domain filters, thereby obtaining vector corrected modulated signals, representing the voltage and current or incident and reflected wave at the DUT. This contrasts with the vector correction in a classic VNA where the correction is performed by matrix multiplication per frequency. In some embodiments the signal processing can also be arranged for performing the vector correction in the frequency domain by converting the digitized modulated signals to frequency domain.

Based on the reconstructed modulated signals at the DUT it is possible to extract different types of models for the linear and non-linear DUT behavior. It is possible to extract better specifications such as EVM, as different types of correlation techniques can be used between the input and output signals at the DUT, while it is possible to use signals compliant with the different communication standards.

In a further aspect the invention also relates to a method for determining at least one characteristic of a DUT at a given frequency by applying a measurement system as described above. The measurement system is in connection with a generator for generating a first and second frequency component, whereby at least the second frequency component is offset from the at least one frequency at which the DUT is characterized. The generated first and second frequency components to the DUT can be applied to the DUT and signals can be received from the DUT. The measurement system is arranged to obtain a repetitive power sweep at the input or a changing and repetitive load impedance at an output of the DUT. The data acquisition and processing unit of the measurement system is configured to calculate from the vector corrected received signals at the DUT the at least one characteristic as a function of time and a combination of a source match and an available power and/or a changing and repetitive load impedance as a function of time, such that the characteristic as a function of time can also be represented as a function of the combination of the source match and the available power or the load impedance by eliminating the quantity 'time'. The method comprises:

a) defining on a Smith chart an area where the characteristic of the DUT is to be determined;
b) generating a first frequency component at the given frequency;
c) generating a periodic amplitude modulated signal with a carrier frequency offset from the first frequency component;
d) measuring with the measurement system voltages and currents at one or more device ports, while the signals generated in b) and c) are applied;
e) determining the at least one characteristic at the given frequency as a function of time, using the measured voltages and currents;
f) calculating the impedance at the output of the DUT as a function of time, using the measured voltages and currents; and
g) mapping the determined characteristic onto the calculated impedance.

In one embodiment a periodic modulated signal is applied at a DUT port and each tone of the periodic modulated signal is complemented with at least one tone. By slightly offsetting the complementary tones, one creates a spectrum across the periodic modulated signal that is swept periodically in amplitude.

In one embodiment a periodic modulated signal is applied at a first DUT port and another periodic phase coherent modulated signal at a second port of the DUT. By slightly offsetting the tones at the second port in frequency, one creates a time-varying wideband impedance at that second port that rotates around the Smith chart.

In yet another embodiment the tones are not only offset, but also amplitude periodic modulation is added and the time-variant wideband impedance not only changes in phase, but also in amplitude.

The invention also relates in another aspect to a method for determining at least one characteristic of a device under test (DUT) across the frequency range of the periodic modulated signal. The method comprises:

providing a measurement system as described above to which a generator for generating a periodic modulated signal is directly connected, each tone of the periodic modulated signal comprises a tone and another tone with slight frequency offset, resulting in two-tones with offset +df and −df, respectively, from the given frequency, the measurement system further comprising signal paths configured to apply the generated signal to an input of the DUT and to receive signals output from the DUT;

measuring with the measurement system voltages and currents at one or more device ports;

determining the at least one characteristic across the given frequencies corresponding to the tones of the periodic modulated signal as a function of time using the measured voltages and currents;

calculating a combination of a source impedance and available power at the input of the DUT in correspondence with the measured input signals slowly changing amplitude as function of time; and mapping the determined characteristic onto the calculated source impedance in combination with the available power by eliminating the time dependency.

Both the measurement system with a plurality of receivers and the measurement system with a plurality of receivers, whereby at least one receiver comprises a switch as described above, can be used in the proposed method.

The invention also relates in another aspect to a method for determining at least one characteristic of a device under test (DUT) across the frequency range of the periodic modulated signal. The method comprises:

providing a measurement system as described above to which a first generator for generating a periodic modulated signal is directly connected and to which a second generator for generating a periodic modulated signal is directly connected, each tone of said periodic modulated signal being at least slightly frequency offset compared to the first periodic signal and possibly being amplitude modulated, the measurement system further comprising signal paths configured to apply the periodic modulated signal generated by the first generator to an input of the DUT and to apply the periodic modulated signal generated by said second generator to an output of the DUT and to receive signals output from the DUT;

measuring with the measurement system voltages and currents at one or more device ports;

determining the at least one characteristic across the given frequencies corresponding to the tones of the periodic modulated signal as a function of time using the measured voltages and currents;

determining a load impedance across the frequency range of the periodic modulated signal at the DUT port connected to said second generator as function of time using the measured voltages and currents; and mapping the determined characteristic across the frequency range of the periodic modulated signal onto the determined load impedance across the frequency range of the periodic modulated signal by eliminating the time dependency.

Both the measurement system with a plurality of receivers and the measurement system with a plurality of receivers, whereby at least one receiver comprises a switch as described above, can be used in the proposed method.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
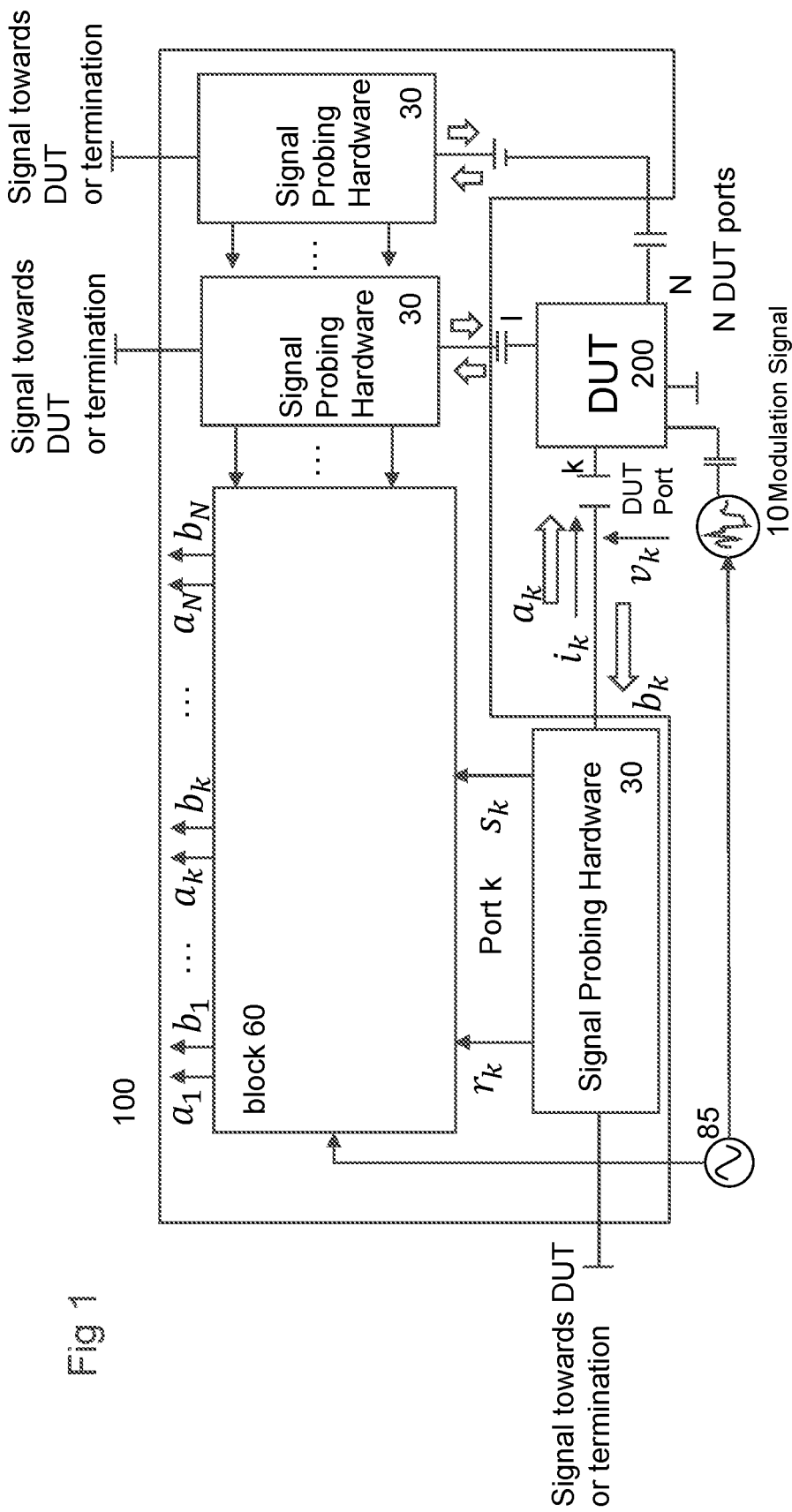
FIG. 1 illustrates a multi-port DUT and the connection of each DUT port at which voltage and current or incident and reflected wave are to be measured (in this particular example all N ports) to a signal probing hardware circuit of the measurement system of the present invention.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention discloses a measurement system wherein vector signal generation and vector signal analysis are brought together and combined with external and internal synchronization technology to render the system scalable across multiple ports of the DUT. The proposed solution enables high quality signal generation and phase coherent measurement of the incident and reflected waves at different ports of a multi-port DUT, supporting increasing modulation bandwidth at increasingly higher carrier frequencies. Essential to the measurement system according to the invention is that it allows for scalability across multiple ports of a DUT while maintaining phase coherent measurement and generation and that it allows for phase coherent measurements fully vector corrected up to the DUT using either frequency-domain or time-domain correction techniques. The time-domain correction enables the use of non-periodic signals and signals that are compliant with for example communication standards.

The measurement system is in one aspect intended for determining voltage and current or incident and reflected wave at at least one port of a multi-port DUT that is excited by at least one modulated signal. The measurement system comprises signal probing hardware which is adapted for probing the voltage and current or incident and reflected wave at at least one port of the DUT while letting a signal flow towards the DUT or while having the capability to provide a termination to the DUT. The termination may be provided inside the measurement system or outside. That signal flowing towards the DUT can be at least one modulated signal that excites the DUT at the at least one port where measurements are performed, or it can be another modulated signal also exciting the DUT. In other words, it may be that one port is excited with a modulated signal and one or more receivers, via a signal probing hardware circuit connected to another port, are used for measurement. The one or more receivers are part of a multi-channel receiver structure of the measurement system. As will be detailed later in this description, in some embodiments there are multiple receivers with each receiver receiving one modulated signal. In other embodiments there may be at least one receiver provided with a switch that can switch between various modulated signals. The digitization of the various modulated signals may be performed in a continuous way while switching between the various modulated signals. This allows processing the acquired signal, resulting again into the various modulated signals in a phase coherent way. This requires the modulated signals to have the same periodicity. In case there is more than one receiver in the receiver structure, the measurement system also comprises a synchronization block external to the multi-channel receiver structure. The measurement system further comprises signal processing means to process the phase coherent modulated signals.

The measurement system offers the capability to measure incident and reflected waves at multiple DUT ports using a synchronization mechanism external to the multi-channel receiver structure. This synchronization mechanism aligns the individual sample clocks of each receiver of the receiver structure using some synchronization hardware comprised in the receiver, and, optionally, controls trigger lines across receivers, possibly taking into account the path length difference to the different receivers, so that all receivers of the multi-channel receiver structure can act together unambiguously. The synchronization principle has been detailed e.g. in US2004/064750, which is hereby incorporated by reference. For receivers containing a downconverter, the LO signal needs to be shared between these different receivers of the multi-channel receiver structure using a LO signal distribution network or by daisy chaining the LO from one receiver to the other or by a hybrid of both techniques.

The performance of vector signal analyzers is improved using the capability of measuring incident and reflected waves accurately at the DUT ports, as the distortion created by the interaction between the measurement instrument and the DUT can now be taken into account. Thanks to these accurate measurements at the DUT one can also predistort the signal to accurately generate the signal at the DUT even in a mismatched environment. This results in an improved performance of vector signal generators. Furthermore, having the capability to measure incident and reflected waves or voltages and currents at the different ports of a multi-port DUT provides better insight in the non-linear behavior of the multi-port device, enabling a trade-off amongst others between linearity and efficiency. It also allows using different correlation techniques between input and output signal to provide improved specifications, e.g. improved error vector magnitude (EVM) measurements. The multi-port DUT can be for example a beamforming IC or a phase array antenna system.

The measurement system (100) of the invention conceptually comprises two main parts:
  the actual hardware to measure phase coherently the incident and reflected wave or voltages and currents, supported by some synchronization means, and
  the software or firmware capable of wideband modulation signal generation and measurement, supporting vector correction up to a reference plane at the DUT, so enabling accurate measurements up to the DUT.

A key feature of the measurement system (100) of the invention is that both the hardware part and the software part scale in number of ports thanks to the scalable synchronization capability. In other words, multiple modules, i.e. receivers of the receiver structure, are able to measure signals in a phase coherent way across multiple ports for narrowband and large modulation bandwidths at low and high carrier frequencies. This is achieved by synchronization means, external and internal to each receiver, and by software that uses both said external and internal synchronization means to synchronize and align the sample clocks in a repeatable way between all receivers of the receiver structure. In a modular architecture, e.g. a PXI architecture without being limited thereto, an embodiment of a module can be a module to measure at one port of a DUT. To measure at different ports of a DUT various of these modules need to be combined and synchronized using the external synchronization block. The external synchronization block can reside in at least one of the modules or in another module. The module to measure at one port of a DUT may contain at least one vector signal receiver complemented with a switch or may contain two receivers. Both result into a module with two receiver inputs. Possibly the signal probing hardware circuit can be integrated into the module resulting into a module with a port connection to the DUT. Additionally, the module is provided with signal processing means, internal synchronization means to synchronize with an external synchronization block when being combined with other modules. Optionally the module also contains a vector signal generator to apply a signal to the DUT and/or to calibrate up to the DUT.

The considered DUT 200 has typically multiple ports (in FIG. 1 N ports) and is excited at at least one port by a modulated signal, as illustrated in the block scheme of FIG. 1. Some DUT ports can be used to apply a DC bias and/or to measure also the bias. One is interested in the signals induced by the modulated signal 10 applied at at least one port, and observed at at least one of the ports, but not necessarily the port or one of the ports used for excitation. It is also possible to apply modulated signals (similar or different) at more than one port, including the ports where signals will be measured. Ports where signals are to be measured but without signal generator can be terminated with a termination load or left open as termination. The modulated signals can be baseband signals or RF signals. The difference between both is that the baseband signals do not require upconversion hardware while RF signals typically do.

At the DUT ports signals are induced which may be the mixing products of the excitation signals (i.e. sums and differences of the spectral content) possibly complemented with one or more DUT dependent signals, e.g. a voltage controlled oscillator signal. The terminations also influence the induced signals. Signal probing hardware (i.e. one or more signal probing hardware circuits) 30 is used to measure these induced signals in an analog way. At low frequencies, e.g. typically below 1 GHz, the voltage and the current are probed with, typically but not limited to, voltage and current probes. At higher frequencies (typically above 1 GHz) incident and reflected waves are probed typically with couplers, without being limited thereto. To measure the lower frequency signals a receiver of the multi-channel receiver structure comprises digitization means (typically a digitizer comprises an analog-to-digital converter) which can be used directly, i.e. without downconverter. To measure the higher frequency signals, however, they typically need to be downconverted in one or another known way before being digitized. The digitization means needs to be construed in general sense such that for IQ demodulation the term actually refers to two digitizers providing the in-phase and quadrature signals I and Q. Similarly, the downconverter, when needed, may comprise two downconverters or mixers driven by a local oscillator in quadrature to result into an I and Q signal.

The signal probing hardware circuit allows a signal to flow to the DUT as excitation or one can also terminate the signal probing hardware circuit at the source side with one or another termination load. During calibration of the measurement system, however, a signal flows to the port while connecting calibration standards in place of the DUT. These calibration standards can be e.g. load-open-short, which is well known in vector network analyzer measurements but also e.g. a power sensor for power calibration and/or a phase standard for phase calibration.

Figure 2:
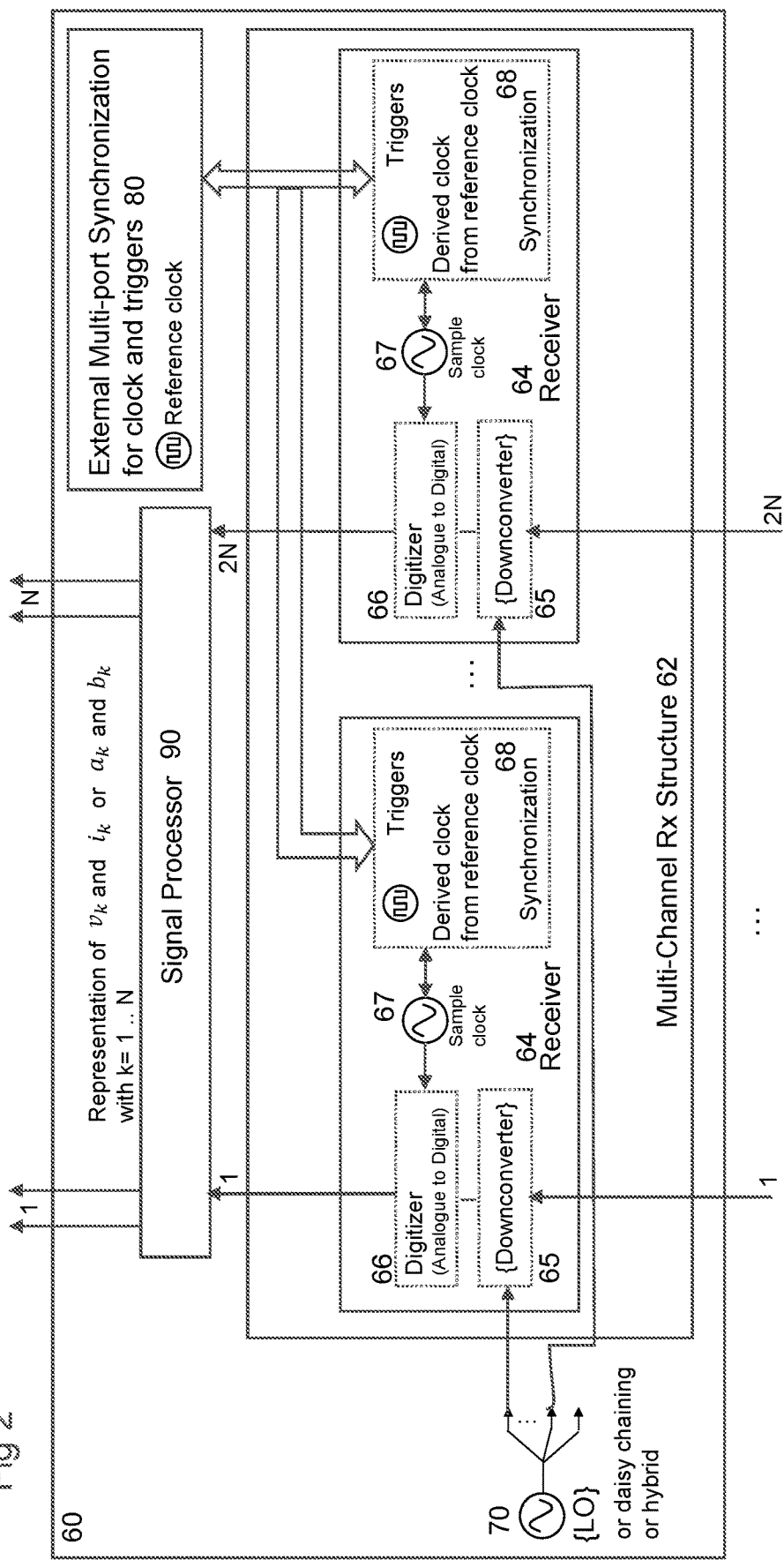
FIG. 2 illustrates a block scheme implementation of block 60 (FIG. 1) of the measurement system.

As a measurement at at least one port is carried out, the signal probing hardware circuit provides at least two signals to measure, i.e. an incident and a reflected signal. In general, though, more ports are measured by means of more signal probing HW circuits. FIG. 2 illustrates an embodiment of the part of the measurement system shown as block 60 in FIG. 1, with the multi-channel receiver structure 62 as an important building block. The illustrated receiver structure comprises a plurality of receivers 64. In embodiments where RF signals are to be measured, downconverters 65 downconvert the signals before digitization 66. As phase coherent measurements across all ports of interest are required, these downconverters need to share a common local oscillator (LO) 70. This common LO is in some embodiments provided by one LO, distributed via a signal distribution network (e.g. power splitter network) to all downconverters. In other embodiments the common LO can be realized via a daisy chained network going from one downconverter to the other, whereby the phase coherency is maintained through proper signal conditioning. As also indicated in FIG. 2, it can also be a hybrid configuration of both options presented above. The LO can be part of the measurement system (as in FIG. 2) or can in some embodiments be applied via an external connection.

As illustrated in FIG. 2, the multi-channel receiver structure comprises in embodiments two or more receivers 64, which can measure the two probed signals that are via the signal separation hardware circuit connected to at least one port of the DUT. When measuring at more ports, more receivers are needed in the receiver structure. Due to the increase in sample rate of the digitizers and the need to support multiple channels, the increase in jitter that occurs when sharing one sample clock across multiple digitizers reduces the digitizer performance. Instead an own sample clock 67 is provided for every digitizer 66. Some additional hardware and/or software is required to make sure all sample clocks get aligned in a consistent and repeatable way. This is important in order to ensure phase coherent and repeatable multi-channel measurements can be performed even after switching off and on the hardware. Also after a calibration one sometimes wishes to switch off and on the system while the validity of the error coefficients is maintained. This additional hardware is provided by the external multi-port synchronization 80. A part of the required software or all the software can be implemented in the signal processing block 90 or inside the external multi-port synchronization block if it is provided with some signal processing capability. The external multi-port synchronization 80 contains a reference clock that is shared with the different receivers 64. Additionally, in embodiments each receiver is provided with an additional synchronization circuit 68 which derives a clock signal from the shared reference clock signal to synchronize its own sample clock in a phase coherent consistent way. The derived clock signals typically have the same frequency for all receivers of the multi-channel receiver structure establishing a common reference, and as such the phase differences between the receivers can be measured and corrected. To support this capability in certain embodiments a trigger mechanism needs to be implemented in the external synchronization block. The trigger mechanism takes care of the proper unambiguous timing between the receivers while taking into account that path lengths between the receivers may be different to eliminate ambiguity. To enable the functionality of measuring and correcting phase differences, the external synchronization block needs to have access to some processing and control capability and needs to be able to interact with each receiver or at least with the synchronization circuitry of each receiver. As mentioned above, the synchronization principle was revealed already in the art, e.g. in US2004/064750.

To enable this functionality, it is essential that the frequencies of all signals be correct. As such at least all receivers, but typically also all generators, share a master clock (e.g. a 10 MHz clock) 85 so that no frequency errors are made between receivers and the external multi-port synchronization block. The master clock can be provided in different ways. The master clock can be external to the various receivers of the multi-channel receiver structure and to the external multi-port synchronization block. Possibly this master clock is comprised in the external multi-port synchronization block and shared with the receivers. In other embodiments the external multi-port synchronization block is connected to an external master clock before distribution to the receivers. In other embodiments the master clock is distributed such that each hardware requiring a master clock can connect to the distributed master clock.

Figure 3:
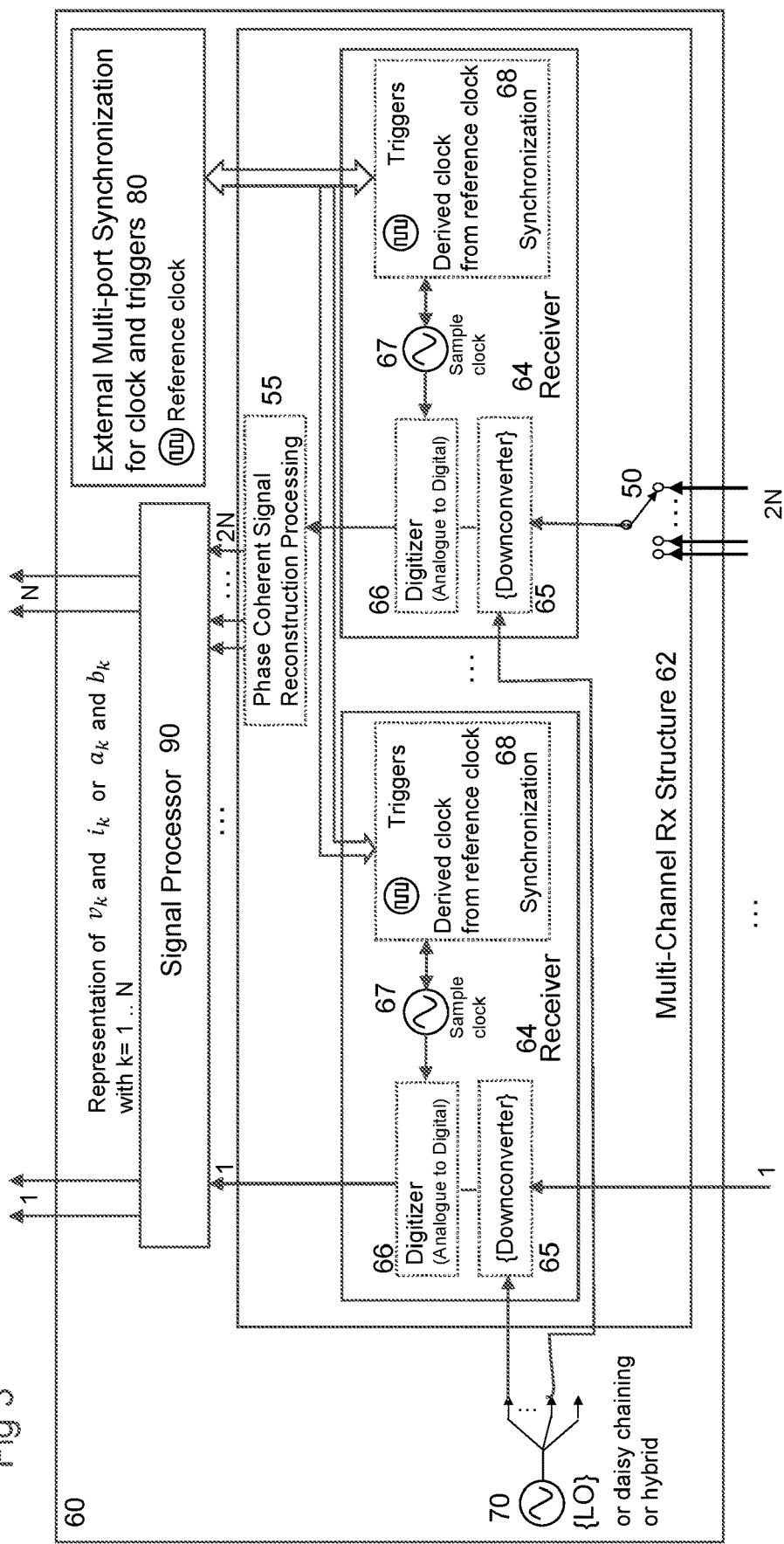
FIG. 3 illustrates an embodiment of a multi-channel receiver structure wherein at least one of the receivers is provided with a switch.

The multi-channel receiver may in certain embodiments comprise only one receiver provided with a switch 50 (FIG. 3). The latter can switch from signal to signal as the signals are returned by the signal probing hardware. In this case it is important to provide for a phase coherent signal reconstruction processing block 55. As the digitizer 66 keeps continuously sampling while the switch 50 is switching from channel to channel, the samples coming from the different probed signals are phase coherent. The phase coherent signal reconstruction processing 55 needs to eliminate the effect of the switching thereby identifying the individual digitized probed signals. The switching effects are so skipped and the time position of the individual probed signals is identified. As a result the multi-channel receiver can provide measured signals, equivalent to a multi-channel receiver structure comprising a plurality of receivers. The requirement, though, is that the applied modulation signals share a common periodicity. An alternative to the continuous sampling as discussed above, may be counting the number of samples being skipped while changing from one channel to the next. Also in this way the phase coherence between samples is maintained. As only one receiver is present, there is no need for a synchronization circuit in the receiver, neither for the external synchronization block.

In some embodiments the multi-channel receiver structure can be a hybrid configuration wherein at least one of the receivers, but not all, is provided with a switch. Such a case is depicted in FIG. 3, wherein also the phase coherent signal reconstruction processing block 55 can be seen. In this case each receiver needs to have an additional synchronization circuit 68 and the external multi-port synchronization block 80 needs to be present to work with the receivers or at least with the additional synchronization circuit 68 of the receivers as earlier explained. Due to the presence of at least one switch the applied modulation signals need to share a common periodicity. Note that also in case there is a plurality of receivers each provided with a switch as described above, the additional synchronization circuit 68 and the external multi-port synchronization block 80 needs to be present to work with the receivers.

For the purpose of this invention the channels of the multi-channel receiver structure get mainly connected to the signal probing hardware to measure via the signal probing hardware circuit the incident (rk) and reflected (sk) wave at a port k. After calibration one can derive the actual incident (ak) and reflected (bk) waves from the measured quantities using vector correction, which accounts for the hardware between the calibration plane and the digital numbers provided by the multi-channel receiver structure. These corrections are performed by the signal processing unit 90. For example in a set-up as depicted in FIG. 1 with a DUT with N ports at which voltage and current or incident and reflected wave are to be determined, 2N inputs (channels) are connected to the multi-channel receiver structure which connects to the signal processing block, resulting in corrected waves after processing. Note, however, that in other embodiments it may be that one is interested in less than all ports of the DUT, i.e. in less than N ports. Obviously, also less than 2N inputs are required then. The signal processing unit can be implemented for example as a FPGA arranged to process synchronously the measurements provided by the multi-channel receiver structure (see FIGS. 2 and 3). In other embodiments the signal processing unit could be a piece of software in the host PC.

Figure 4:
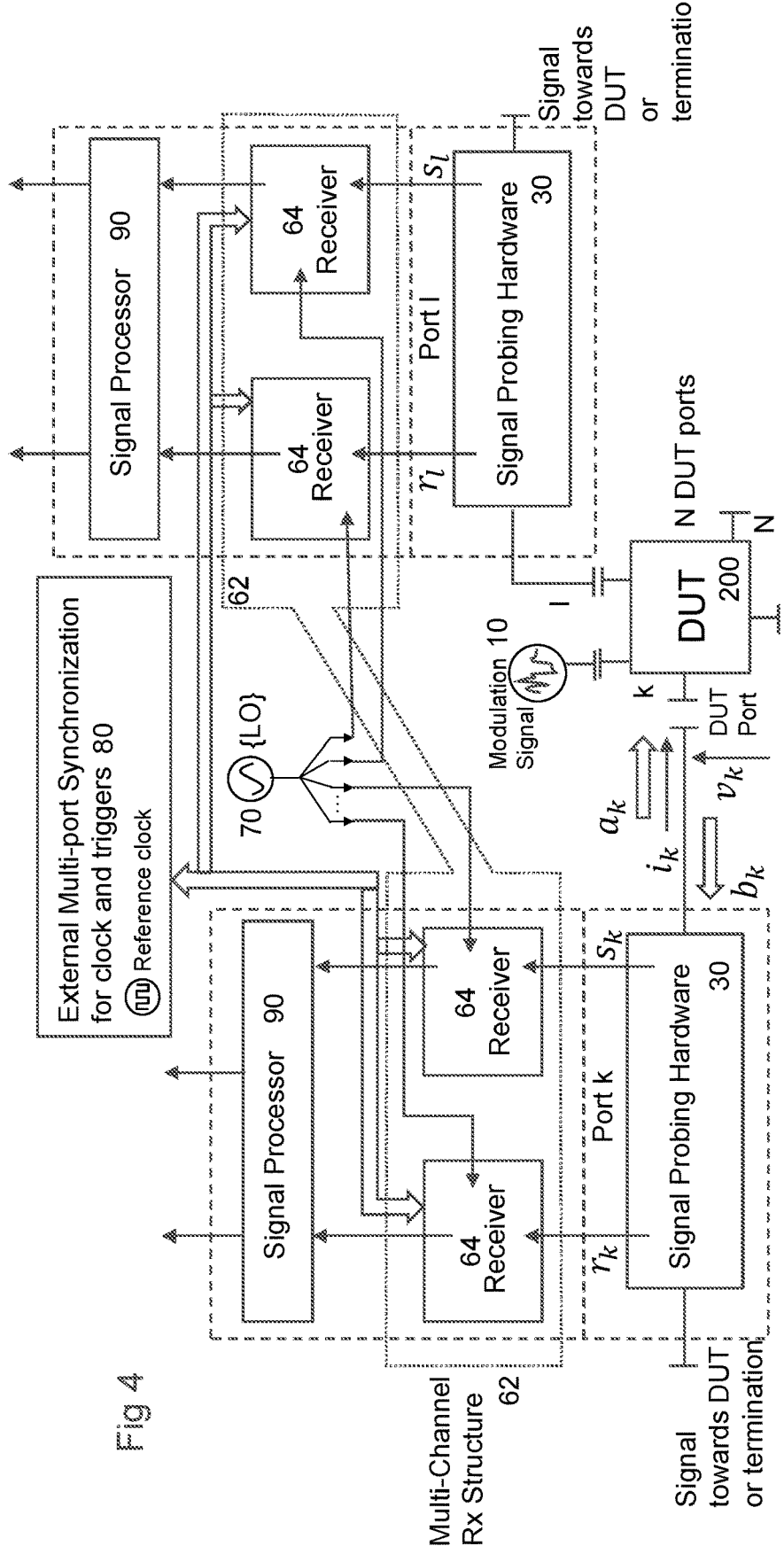
FIG. 4 illustrates an embodiment of the measurement system wherein at least some signal probing hardware circuits are connected via the multi-channel receiver structure to a dedicated signal processor.

The signal processing can in some embodiments be organized differently, for example providing a signal processor 90 per signal probing hardware circuit 30 such that the incident and reflected wave at the DUT are reconstructed per DUT port of interest, i.e. per DUT port where is measured. FIG. 4 illustrates an embodiment where the signal probing hardware circuits 30 connected to ports k and l of the DUT, respectively, are each connected to their own signal processing block 90. It is important that the receivers still operate phase coherently and as such they can still be considered part of a multi-channel receiver structure. In this case the signal processor with the part of the multi-channel receiver structure to support the measurement of the signals coming from the signal probing hardware circuit, corresponding to one port, can be combined into a single hardware module, for example a PXI module. In another configuration the signal probing hardware circuit may even be integrated into that PXI module.

In the above embodiment having a signal processor and part of the multi-channel receiver structure integrated into a single hardware module, e.g. PXI module, dedicated to a DUT port via the signal probing hardware circuit (see FIG. 4), also a transmit source can be integrated into that same module. To economize on the number of transmit sources, in some embodiments there is no transmit source per DUT port provided. Rather a reduced number of transmit sources is provided, which are switched around to different DUT ports with some additional switching circuitry, depending on the application.

Figure 5:
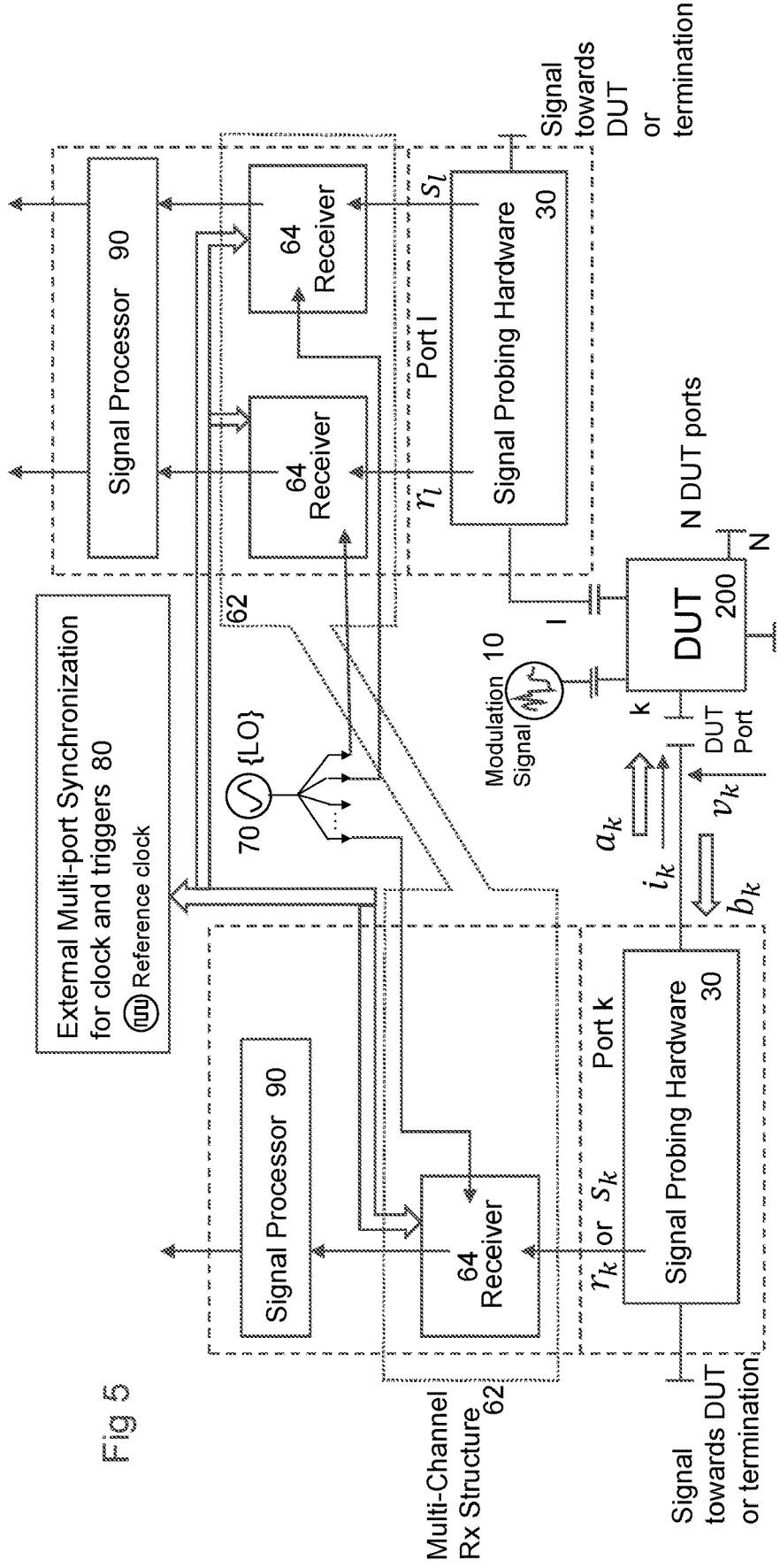
FIG. 5 illustrates an embodiment wherein a signal probing hardware circuit outputs only one quantity to the multi-channel receiver structure.
Figure 6:
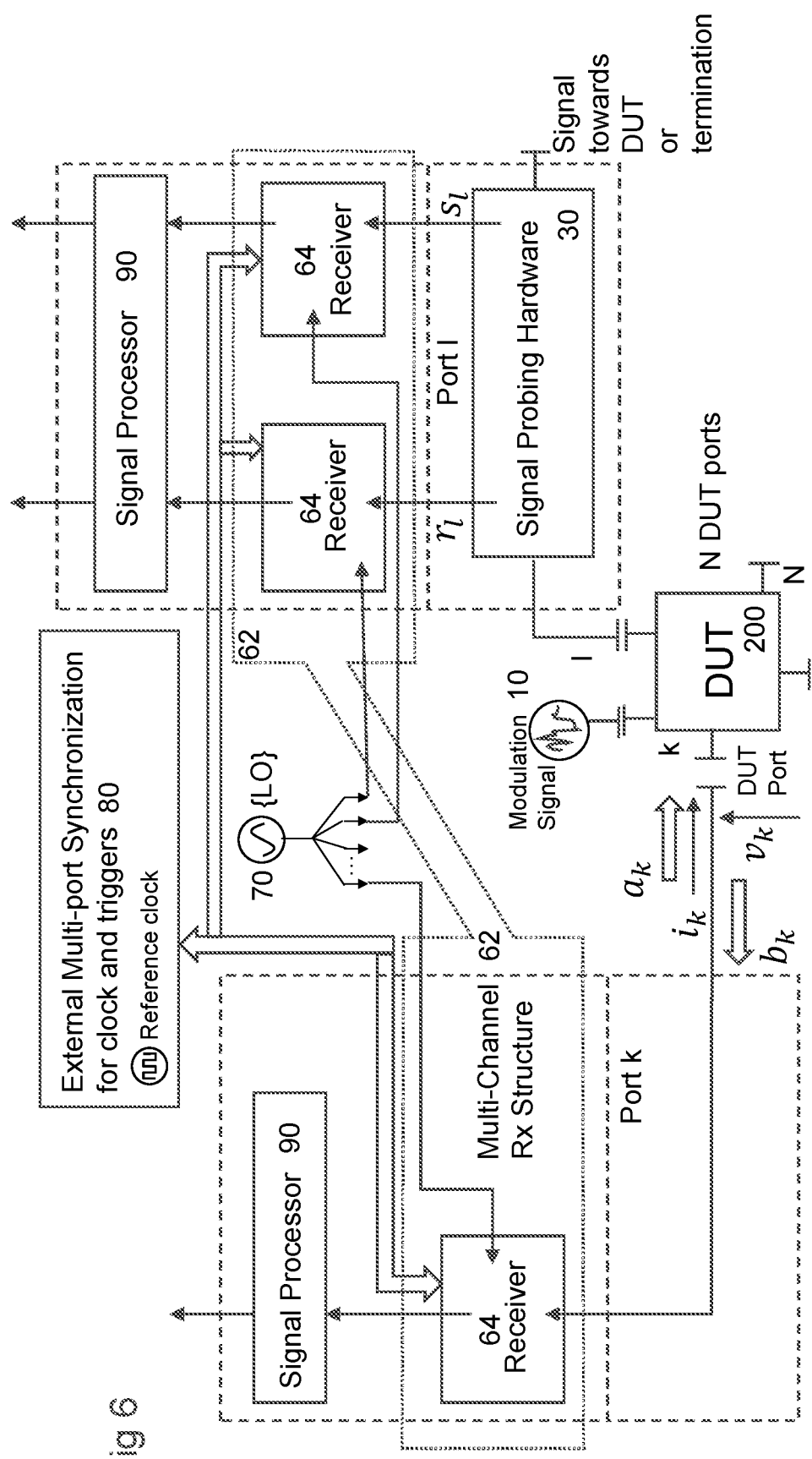
FIG. 6 illustrates a signal probing hardware circuit used a pass-through so that a channel of the multi-channel receiver structure is directly connected to the DUT port in question.

In certain use cases it is sufficient to know at at least one port an approximation of the incident or reflected wave, without need for full port correction. In that case the signal probing hardware circuit at that at least one port probes one quantity only (i.e. rk or sk) and needs only one channel of the multi-channel receiver structure. FIG. 5 illustrates such an embodiment. In other cases, one just wants to measure what comes out of at least one port of the DUT without requiring the capability to have a signal flow to that port or to apply a termination other than the termination of the receiving channel. In that case a channel of the multi-channel receiver structure is directly connected to that DUT port (FIG. 6), whereby the signal probing hardware circuit is mainly a pass through. This case reduces itself to the regular use case of a vector signal analyzer that gets connected to a port of a DUT. It is not possible to correct for any distortion that happens between the vector signal analyzer and that DUT port. It is neither possible to provide a different termination than the determination of the vector signal analyzer. In certain embodiments where one requires the signal probing hardware at one or more DUT ports, there can be one or more DUT ports where accuracy is less important and where no need exists to change the termination.

In some embodiments the signal from the signal source can be constructed in such a way that it can compensate for the hardware between the signal source and the DUT plane such that the signal at the DUT is the desired signal. The signal put in the arbitrary waveform generator (AWG) is then predistorted to compensate for path distortions towards the DUT. In this configuration it is even possible to synthesize impedances in an active way at the DUT. Instead of predistorting the signal applied to the AWG to get the correct signal at the DUT, the signal put in the AWG is calculated to synthesize a given impedance as function of frequency at DUT. In this case it requires the presence of at least one signal at DUT to excite the DUT. Like a receiver of the receiver structure, the signal generator can perform in some embodiments direct signal generation without upconverter or can use in other embodiments an upconverter to achieve higher frequency bands. In the latter case the LO of the upconverters is shared in a similar way as for the multi-channel receiver structure between the different signal generators when the application requires phase coherent signal generation.

An approach with a signal probing hardware circuit at each relevant DUT port in combination with a multi-channel receiver structure comprising a plurality of receivers as in the present invention, is preferable over the use of a multiplexer at one or more signal probing hardware blocks to multiplex the signal probing hardware block to different relevant DUT ports. Such a multiplexer can be used to excite and measure across different DUT ports. This can be useful for beamforming ICs where one wants to measure across multiple ports in pairs, typically, but not exclusively, between the input and an output or between two outputs. In this case one is not interested to analyze the N-port behavior of a DUT but instead just needs to analyze the behavior per pair of DUT ports. The multiplexer after the signal probing hardware, however, degrades the measurement accuracy due to reduced directivity and increased loss, as is very well known in VNA (vector network analyzers) architectures.

Optional signal conditioning hardware may be needed in combination with the signal generator to e.g. adjust and/or filter the signal levels to provide the proper levels with proper spectral content to the DUT. For example to characterize amplifiers the signal level of the signal generator possibly needs to be increased while being filtered for removing harmonics. This optional signal conditioning hardware is connected at the source side of the signal probing hardware such that the signal can be properly conditioned before going into the signal probing hardware (see FIG. 1).

Figure 7:
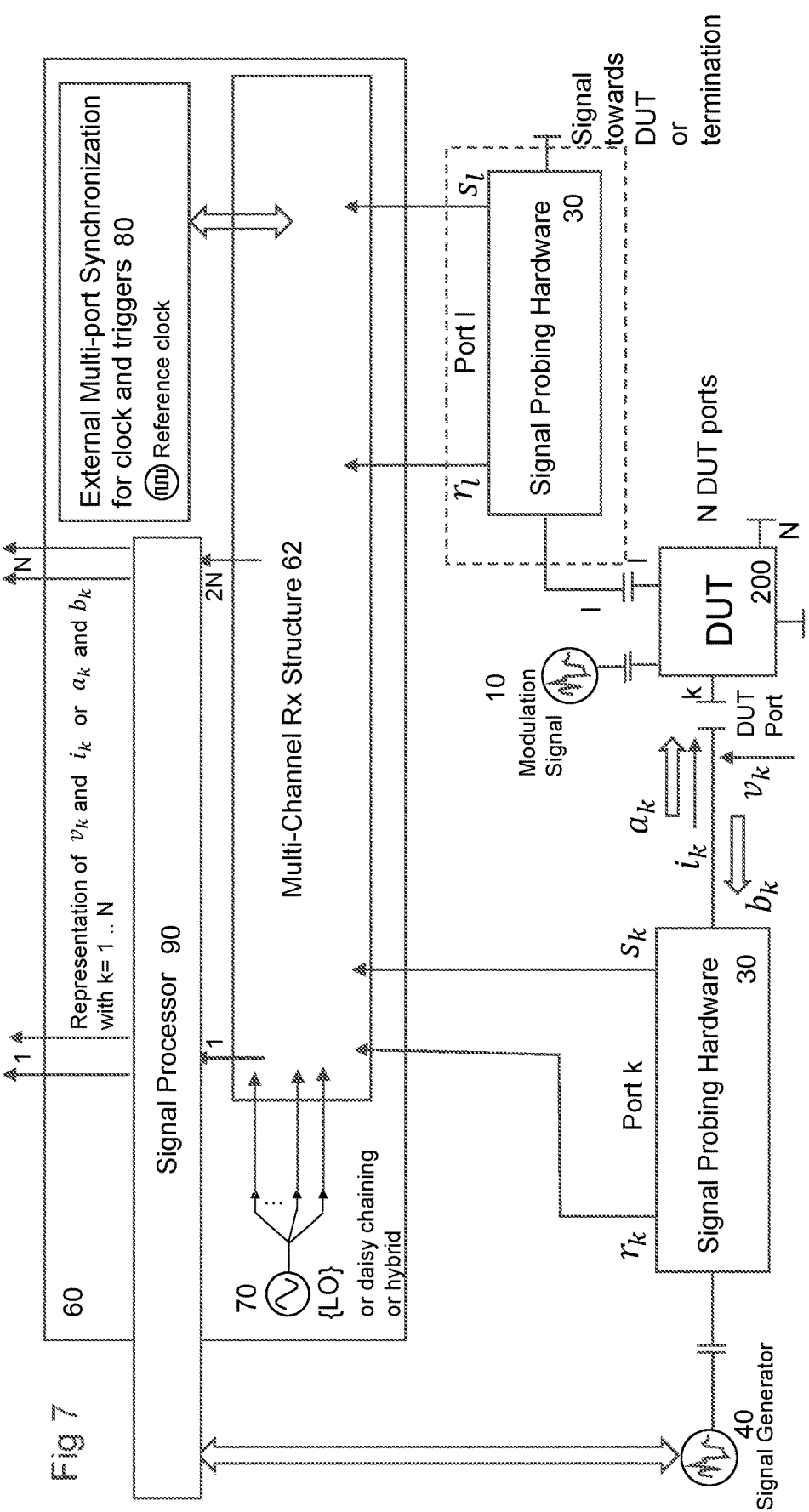
FIG. 7 illustrates an embodiment where connection is provided between a signal processing unit and a signal generator.

In certain embodiments the use of one or more of the signal generators 40 can be combined with the capability to measure phase coherently the incident and reflected waves at a DUT port via a signal processing unit 90. FIG. 7 provides an illustration. The signal processing unit can in some embodiments be a FPGA running fully synchronously between the signal measurement and the signal generation. In this way it is possible to synthesize signals phase coherently with the measurements such that the required signals are generated on the fly at the DUT, within the latency limits and bandwidth of the signal processing unit.

At minimum, the signal processing unit in conjunction with the multi-channel receiver structure supports the signal acquisition from the couplers. Additionally, the error correction techniques to correct for the hardware distortion between the reference plane at the DUT and the digital numbers provided by the digitization means, can be implemented in the signal processing unit. In other embodiments the error correction can be implemented in other computational devices, like e.g. a host computer. These error correction techniques can be implemented in the frequency, time or mixed time/frequency domain or by any other transformation. The measurement system of the invention enables the vector correction techniques in the time-domain. In particular, the time-domain vector correction can be realized by means of a set of digital time-domain filters, e.g. FIR or IIR filters. System identification techniques exist to convert the typical frequency domain error coefficients into time domain filters. Different challenges need to be taken care of to make sure the digital filters are stable. The error coefficients are determined by calibration techniques similar to those used with VNAs, without being limited thereto. The VNA-based calibration techniques use periodic calibration signals and result into frequency domain error coefficients. At least the VNA-based calibration techniques are adapted for use with periodic and non-periodic modulation signals. As mentioned earlier, the signal processing can in some embodiments be split per DUT port enabling the realization of PXI hardware modules per DUT port.

Figure 8:
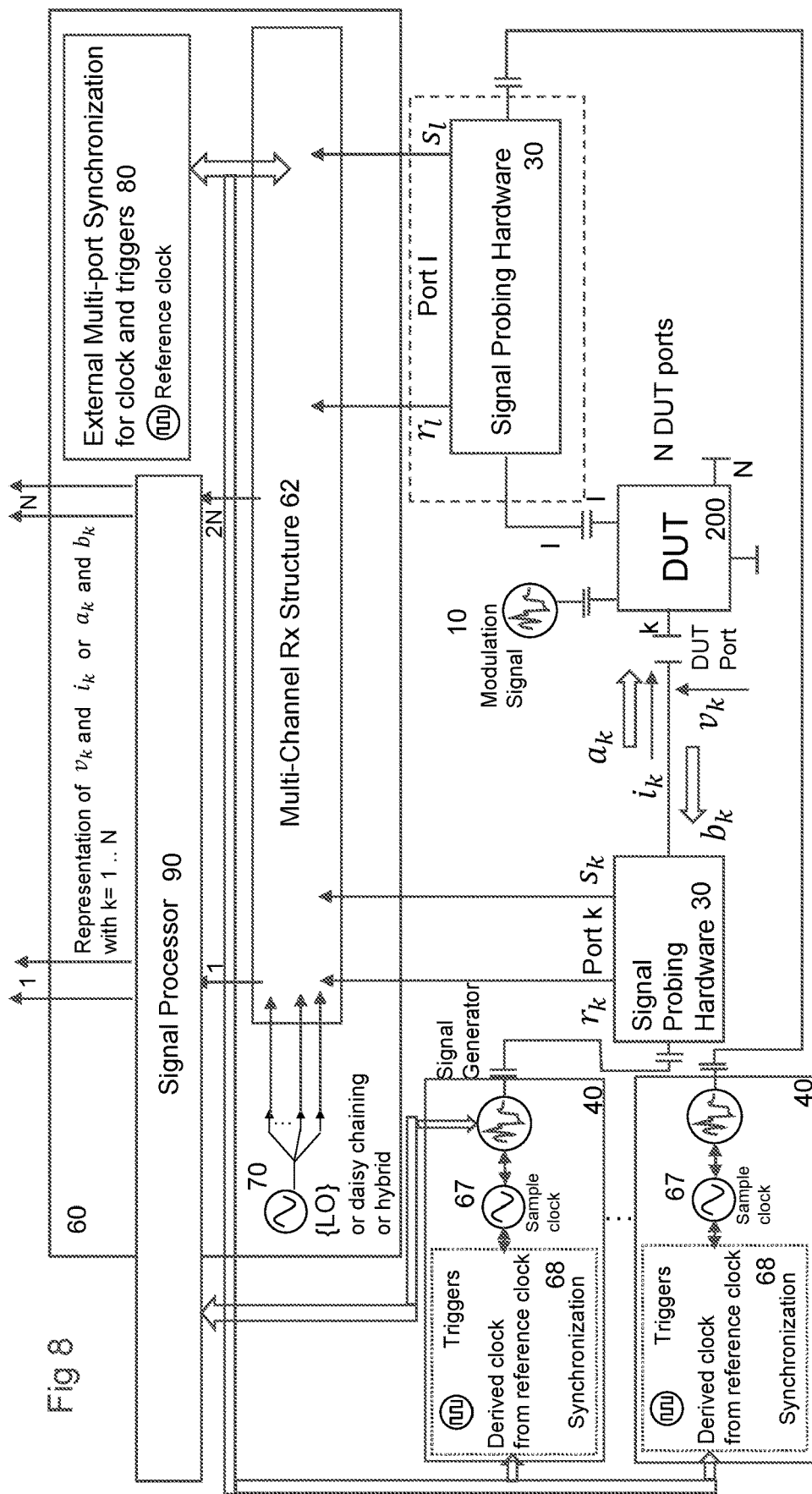
FIG. 8 illustrates an embodiment wherein at least two signal generators are phase aligned together using the multi-port external synchronization block.

As mentioned the signal processing unit can be connected to one or more signal generators for on the fly correction of the signals in the signal generator 40 (FIG. 7). To enable phase coherent signal generation between different signal generators in a similar way as with the receivers, an external multi-port synchronization, independent from but similar to the block external multi-port synchronization block 80, is required. In some embodiments, the signal generators need to be phase coherent with the receivers. In other words, the relationship between the digitization of the measured signals and the conversion to analogue signals of the signal generation need to be phased aligned. In this case the role of the external multi-port synchronization block 80 is extended (FIG. 8) to also synchronize the signal generators or at least the internal synchronization block of the signal generators. The signal generators are adapted in a similar way as the receivers enabling the phase coherency. Note however that the capability for phase coherent signal generation is totally independent of the connection of the signal processing unit to the signal generators.

Figure 9:
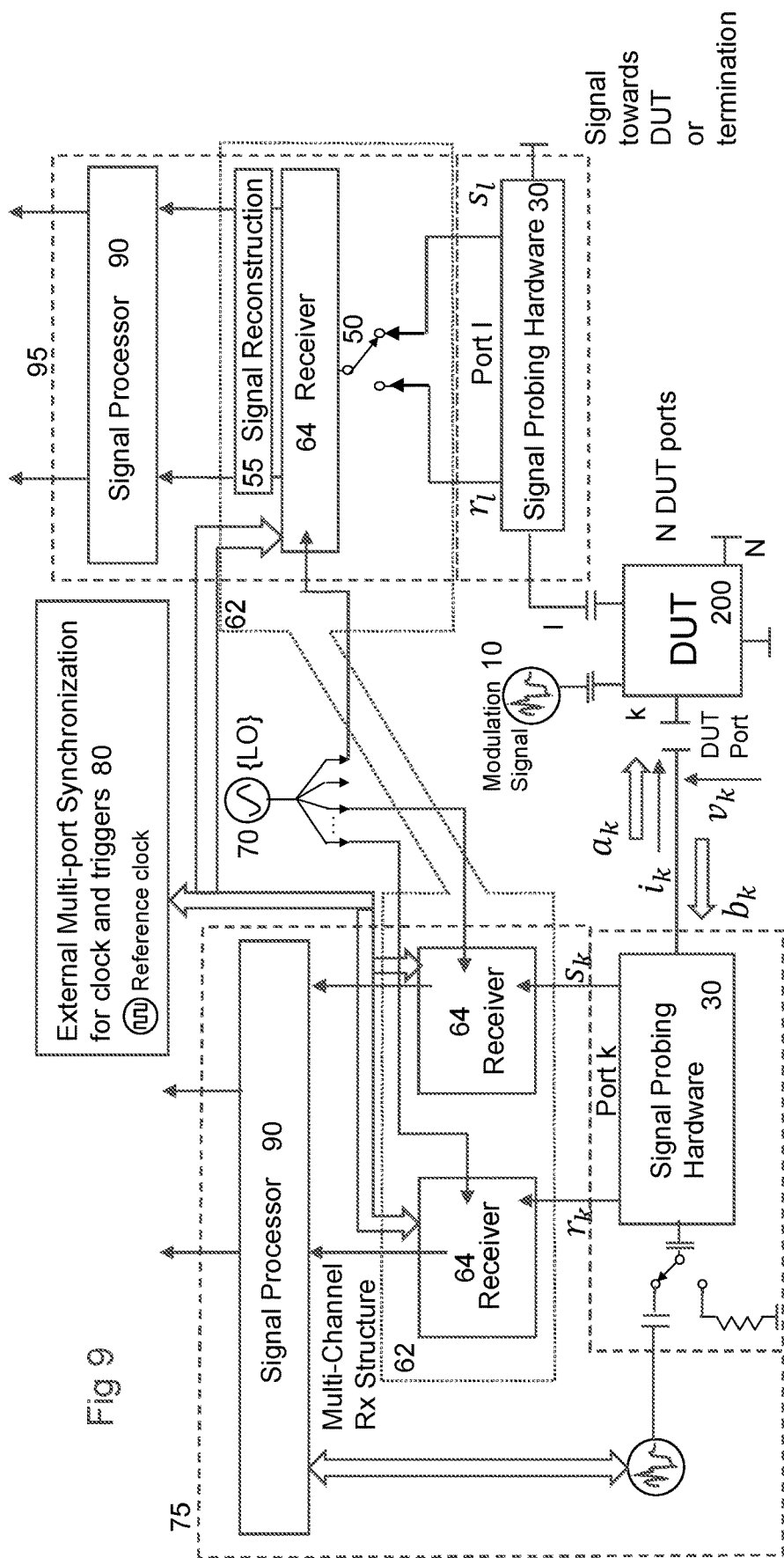
FIG. 9 illustrates an embodiment of the measurement system of the invention wherein a signal source is provided per DUT port while receiving the modulated signals per DUT port via the multi-channel receiver structure, where source and required part of multi-channel receiver structure can be integrated into a module, e.g. a PXI module, and where the signal processor provides signal processing but also control as an alternative to the control via the host.

As mentioned before, different blocks can be combined in different ways in one hardware module, e.g. a PXI module but surely not limited to the PXI architecture only. FIG. 9 illustrates an embodiment where a signal generator and a two-channel receiver, as a special case of the multi-channel receiver, and a signal processing block are combined in one hardware module 75. Typically to serve generality in use, the hardware module does also have the hardware for the multi-port external synchronization capability. Combining different hardware modules together, only one of the modules will be assigned as the one to use its multi-port external synchronization block in conjunction with the others. Only one module can be the master. A hardware module typically also has its own LO in case of a downconverter, but with the possibility to share this LO externally to other modules. Each module also has the possibility to take an external LO. The signal processing unit may support the vector correction for one port providing a representation of the analogue signals at the DUT in time, frequency or frequency—time domain or any other domain that makes sense. This approach offers the benefit that the host processing is off-loaded. The signal processing unit can typically deal with frequency domain, time domain or frequency-time domain vector error coefficients. As already mentioned earlier, the signal probing hardware can be integrated into the PXI module or can be externally. FIG. 9 also illustrates an implementation of a possible hardware module where a one-channel receiver in combination with a switch, complemented with the two channel reconstruction, supporting a two-channel receiver, and a signal processing block are combined in one hardware module 95.

Figure 10:
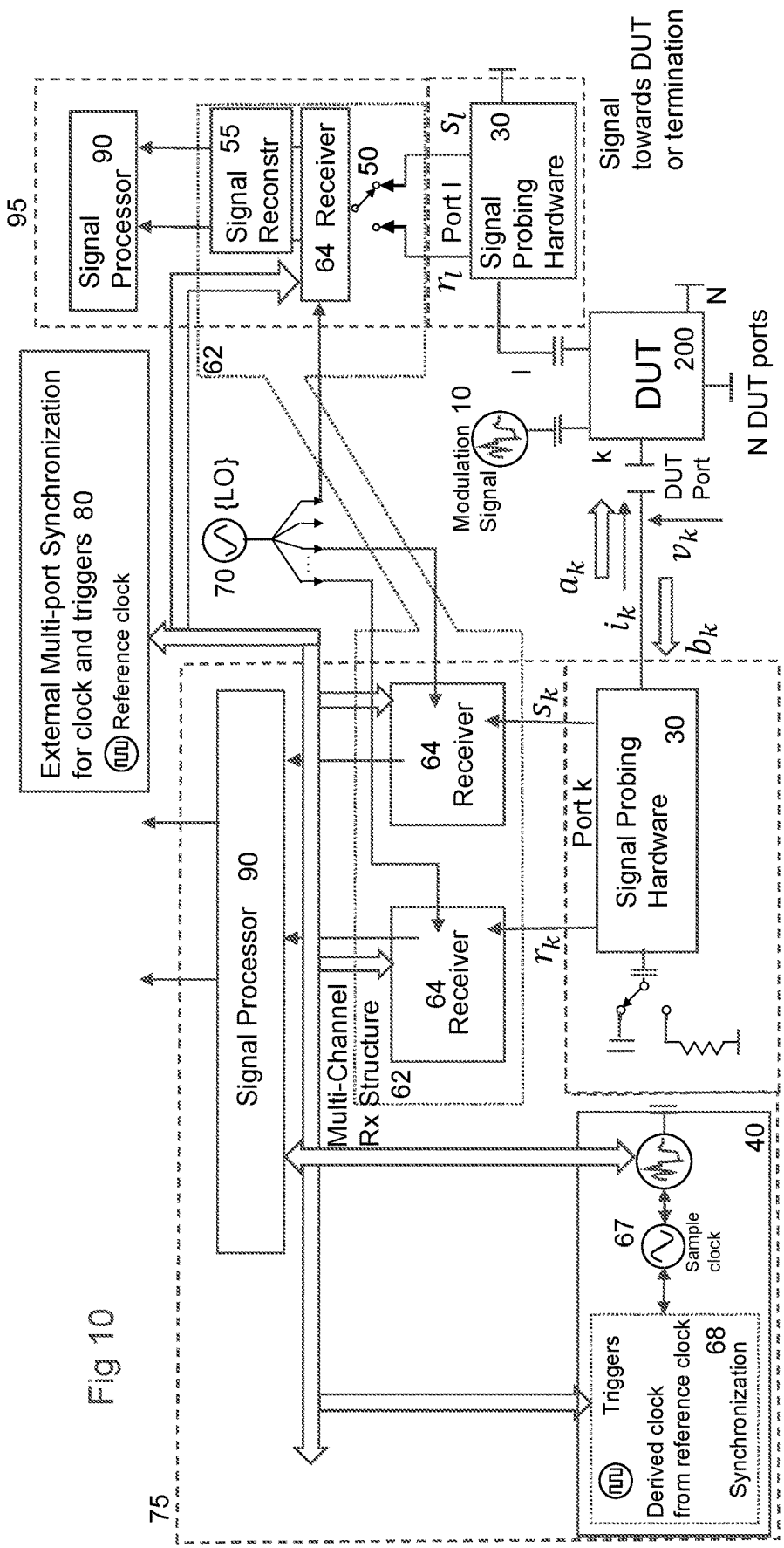
FIG. 10 illustrates that in the embodiment shown in FIG. 9 the signal generator and multi-channel receiver structure can also be controlled by the external synchronization block.

Additionally, to support phase aligned signal generation the multi-port internal or external synchronization block can phase align the signal generation (FIG. 10). In FIG. 10 thanks to configuration of the hardware blocks, another mode of synchronization can be implemented in case every hardware module used to measure at a port of a DUT has a signal generator. The multi-port external synchronization block can be used to only synchronize the signal generators together and the signal generators will create a marker, i.e. a kind of trigger aligned with the digital signal generation, to trigger phase coherently with the signal generation the data acquisition by the receiver. This also results in phase coherent measurements.

The different embodiments of the measurement system according to this invention enable the practical realization of real-time device characterization as described in U.S. Pat. No. 7,486,067 B2, hereby incorporated by reference. U.S. Pat. No. 7,486,067 B2 relies on the application of at least one tone to one input of a DUT and a second tone to the same input wherein the second tone is at least frequency offset from the first tone or a second tone to a second input of the DUT, wherein the second tone is at least frequency offset from the first tone and where the second tone can be a periodic amplitude modulation signal. The embodiments of the measurement system of the present invention are realizations of the network analyzer referred to in U.S. Pat. No. 7,486,067. The measurement system of the present invention enables phase coherent measurements at different DUT ports under phase coherent signal generation. As such the concept of the frequency offset tone for real-time device characterization can be generalized to periodic modulated signals, assuming a periodic modulated signal at one of the DUT ports and another periodic phase coherent modulated signal at a second port of the DUT. By slightly offsetting in frequency all the tones at the second port, one creates a time-varying wideband impedance at that second port that rotates around the Smith chart as the frequency offset results into a time varying phase. By not only offsetting the tones but also adding amplitude periodic modulation the time-variant wideband impedance not only changes in phase, but now also in amplitude. In a more simplistic case, assuming a periodic modulated signal only at one port of the DUT, it is possible to complement each tone with a tone, slightly offset in frequency, creating a slow-varying modulation signal that sweeps its whole spectrum periodically in amplitude. This is very similar to the case where the amplitude of the input spectrum would be stepped and for each amplitude setting, the signals would be measured at the DUT and analyzed providing for example the input to output gain across the spectrum. This can be repeated for each amplitude setting. Thanks to complementing each tone of that spectrum with a second tone, the amplitude is automatically changed slowly over time. The speed of change depends on the offset between the tones. This enables real-time characterization of a component under modulation signals.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method for determining at least one characteristic of a device under test, DUT, as a function of time across a frequency range of a periodic modulated signal, the method comprising:
  a) generating a first periodic modulated signal across the frequency range
  b) generating a second periodic modulated signal with a frequency offset from the frequency range;
  c) performing a measurement, at one or more ports of a plurality of ports of the DUT while the first periodic modulated signal is applied to a first port of the DUT and the second periodic modulated signal is applied to a second port of the DUT, of one or more of
    voltages and currents, or
    incident and reflected waves,
  wherein performing the measurement comprises
    obtaining probed signals by probing one or more of
      the voltages and currents, or
      the incident and reflected waves,
    receiving two probed signals of the probed signals in a multi-channel receiver structure comprising a plurality of receivers, wherein in each of the plurality of receivers a corresponding one of the two probed signals is phase coherently digitized with a respective digitizer having its own sample clock, wherein the respective sample clocks of the plurality of receivers are synchronized in a synchronization block comprising a reference clock derived from a master clock, and
    processing the phase coherently digitized probed signals to obtain one or more of
      the measured voltages and currents, or
      the incident and reflected waves; and d) determining the at least one characteristic as a function of time across the frequency range, using one or more of
   the measured voltages and currents, or
   incident and reflected waves.

2. The method of claim 1, further comprising:
e) calculating an impedance at either the first of the second port of the DUT as a function of time across the frequency range, using one or more of
   the measured voltages and currents,
   or incident and reflected waves; and
f) eliminating time dependency between the determined at least one characteristic and the calculated impedance.

3. The method of claim 1, further comprising:
calculating, as a function of time across the frequency range:
   a source impedance at the first port of the DUT when an available power at the first port of the DUT is known; or
   the available power at the first port of the DUT when the source impedance at the first port of the DUT is known;
and
eliminating the time dependency between the determined at least one characteristic and a combination of the source impedance and the available power.

4. The method of claim 3, further comprising
generating the first periodic modulated signal with an offset −df and the second periodic modulated signal with an offset +df, respectively, across the frequency range, applying the generated first and second periodic modulated signals to the first port of the DUT and receiving signals output from the first or second port of the DUT or from another port of the plurality of ports of the DUT;
determining the at least one characteristic as a function of time across the frequency range using the measured voltages and currents or incident and reflected waves.

5. The method of claim 4, wherein the generating, calculating, and performing measurement are carried out for a plurality of frequency ranges.

6. The method of claim 1, wherein the first port of the DUT and the second port of the DUT are the same.

7. The method of claim 1, wherein each tone of the periodic modulated signal is also modulated in amplitude.

8. The method of claim 1, wherein the signal processing circuit is configured to perform a correction on the digitized probed signals via digital filters to obtain a data stream representing one or more of
   the voltages and currents, or
   the incident and reflected waves.

9. The method of claim 1, wherein the signal processing circuit operates synchronously with each respective digitizer.

10. The method of claim 1, wherein at least one receiver comprises a downconverter.

11. The method of claim 10, wherein at least two receivers comprise a downconverter and wherein a local oscillator is shared between the at least two receivers.

12. A method for determining at least one characteristic of a device under test, DUT, at a given frequency, the method comprising:
a) generating a first periodic modulated signal across the frequency range
b) generating a second periodic modulated signal with a frequency offset from the frequency range;
c) performing a measurement, at one or more ports of a plurality of ports of the DUT while the first periodic modulated signal is applied to a first port of the DUT and the second periodic modulated signal is applied to a second port of the DUT, of one or more
   voltages and currents, or
   incident and reflected waves,
wherein performing the measurement comprises:
   obtaining probed signals by probing one or more of
      the voltages and currents, or
      the incident and reflected waves,
   receiving probed signals in a multi-channel receiver structure comprising a plurality of receivers and digitizer, by switching between a plurality of probed signals from one of multiple signal probing hardware circuits, wherein the digitizer digitizes the received probed signals and has its own sample clock derived from a master clock,
   performing a signal reconstruction to identify in a phase-coherent way the individual digitized probed signals, and
   processing the phase coherently digitized probed signals to obtain one or more of
      the measured voltages and currents, or
      incident and reflected waves,
d) determining the at least one characteristic as a function of time across the frequency range, using one or more of
   the measured voltages and currents,
   or incident and reflected waves.

13. The method of claim 12, further comprising:
e) calculating an impedance at either the first port or the second port of the DUT as a function of time across the frequency range, using the measured voltages and currents or incident and reflected waves; and
f) eliminating time dependency between the determined characteristic and the calculated impedance.

14. The method of claim 12, further comprising:
calculating, as a function of time across the frequency range:
a source impedance at the first port of the DUT when an available power at the first port of the DUT is known; or
the available power at the first port of the DUT when the source impedance at the first port of the DUT is known; and
eliminating the time dependency between the determined at least one characteristic and a combination of the source impedance and the available power.

15. The method of claim 14, comprising
generating the first periodic modulated signal with an offset −df and the second periodic modulated signal with an offset +df, respectively, across the frequency range, applying the generated first and second periodic modulated signals to the first port of the DUT and receiving signals output from the first or second port of the DUT or from another port of the plurality of ports of the DUT
determining the at least one characteristic as a function of time across the frequency range using the measured voltages and currents or incident and reflected waves.

16. The method of claim 15, wherein the generating, calculating and performing the measurement are carried out for a plurality of frequency ranges.

17. The method of claim 12, wherein the first port of the DUT and the second port of the DUT are the same.

18. The method of claim 12, wherein each tone of the periodic modulated signal is also modulated in amplitude.

19. The method of claim 12, wherein the signal processing circuit is configured to perform a correction on the digitized probed signals via digital filters to obtain a data stream representing the voltage and current or incident and reflected wave at the DUT.

20. The method of claim 12, wherein at least one receiver comprises a downconverter.

* * * * *